United States Patent [19]
Blackwood et al.

[11] Patent Number: 5,418,382
[45] Date of Patent: May 23, 1995

[54] SUBSTRATE LOCATION AND DETECTION APPARATUS

[75] Inventors: Robert S. Blackwood, David R. Vaughn, both of Lubbock; Billy R. Masten, Shallowater; Timothy B. Vaughn, Lubbock, all of Tex.

[73] Assignee: FSI International, Inc., Chaska, Minn.

[21] Appl. No.: 125,555

[22] Filed: Sep. 23, 1993

[51] Int. Cl.$^6$ ............................................. G01N 21/86
[52] U.S. Cl. .................................... 250/561; 414/936
[58] Field of Search ................ 250/561, 222.1, 222.2, 250/208.2, 216, 227.21; 377/8, 10, 53, 343, 429; 414/938, 936, 937

[56] References Cited

U.S. PATENT DOCUMENTS

| | | | |
|---|---|---|---|
| 4,678,902 | 7/1987 | Perlin | 250/227.21 |
| 4,786,816 | 11/1988 | Ohmori et al. | 250/222.2 |
| 4,994,666 | 2/1991 | Higgison et al. | 250/222.2 |
| 5,225,691 | 7/1993 | Powers et al. | 250/561 |
| 5,266,812 | 11/1993 | Mokuo | 250/561 |
| 5,308,993 | 5/1994 | Holman et al. | 250/561 |

Primary Examiner—David C. Nelms
Attorney, Agent, or Firm—Palmatier, Sjoquist & Helget

[57] ABSTRACT

A device for detecting and locating substrates in a cassette including a homogeneous columnar radiation source adjacent to and radiating the edges of the substrates, rod-shaped directional lenses transmitting and replicating the substrate edges in their field of view and directing the transmitted reflected radiation and image of the field of view onto sensing pixels activated to produce indications of the presence and location of the substrates in the cassette.

22 Claims, 5 Drawing Sheets

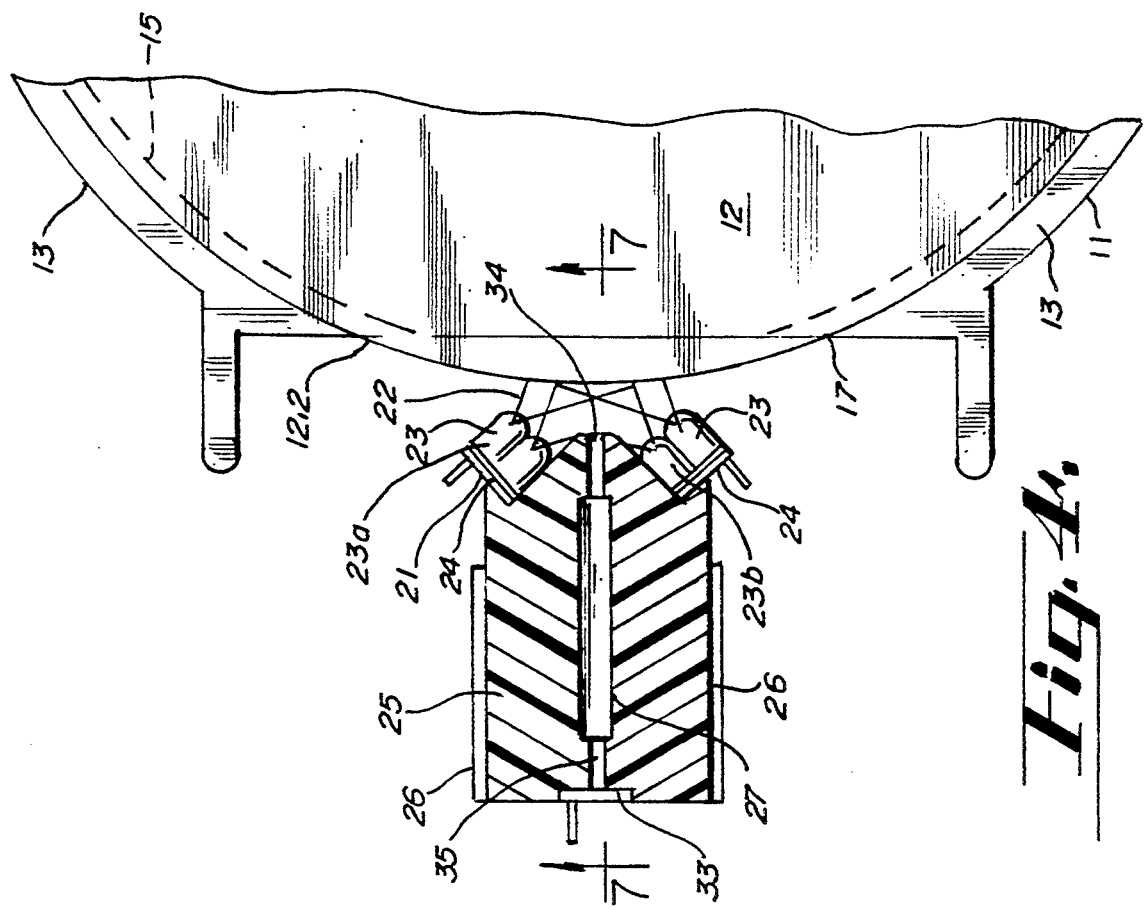
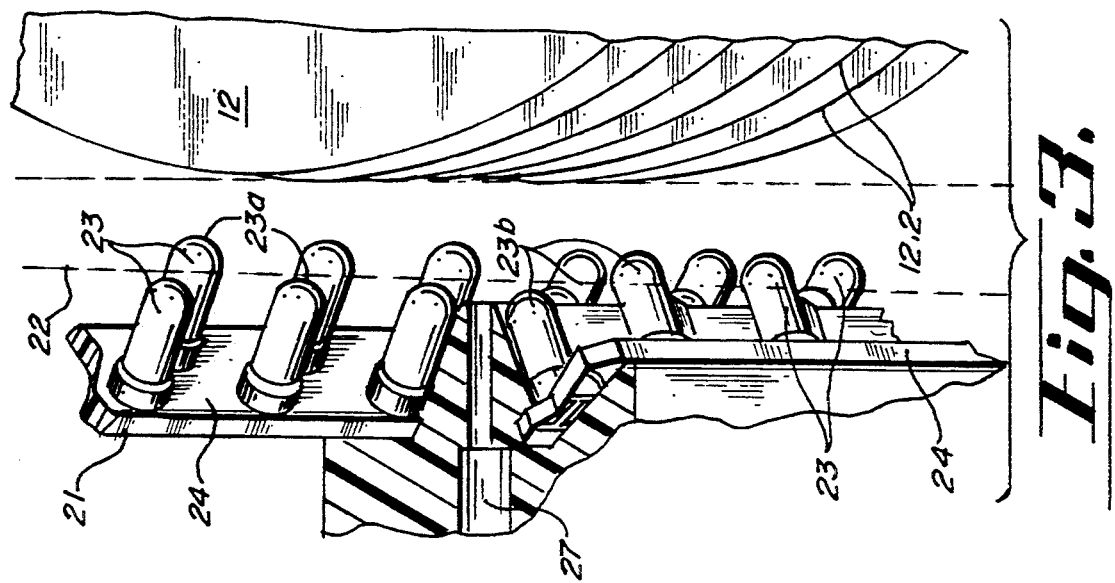

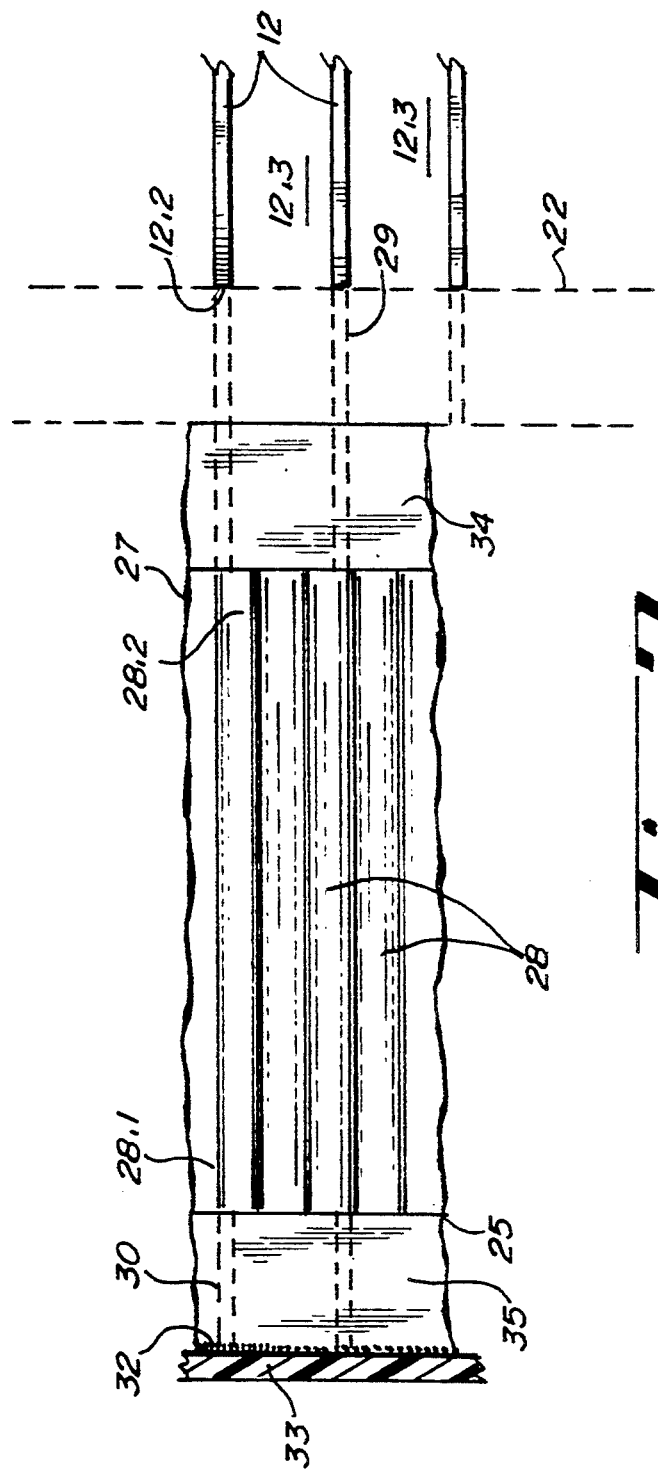

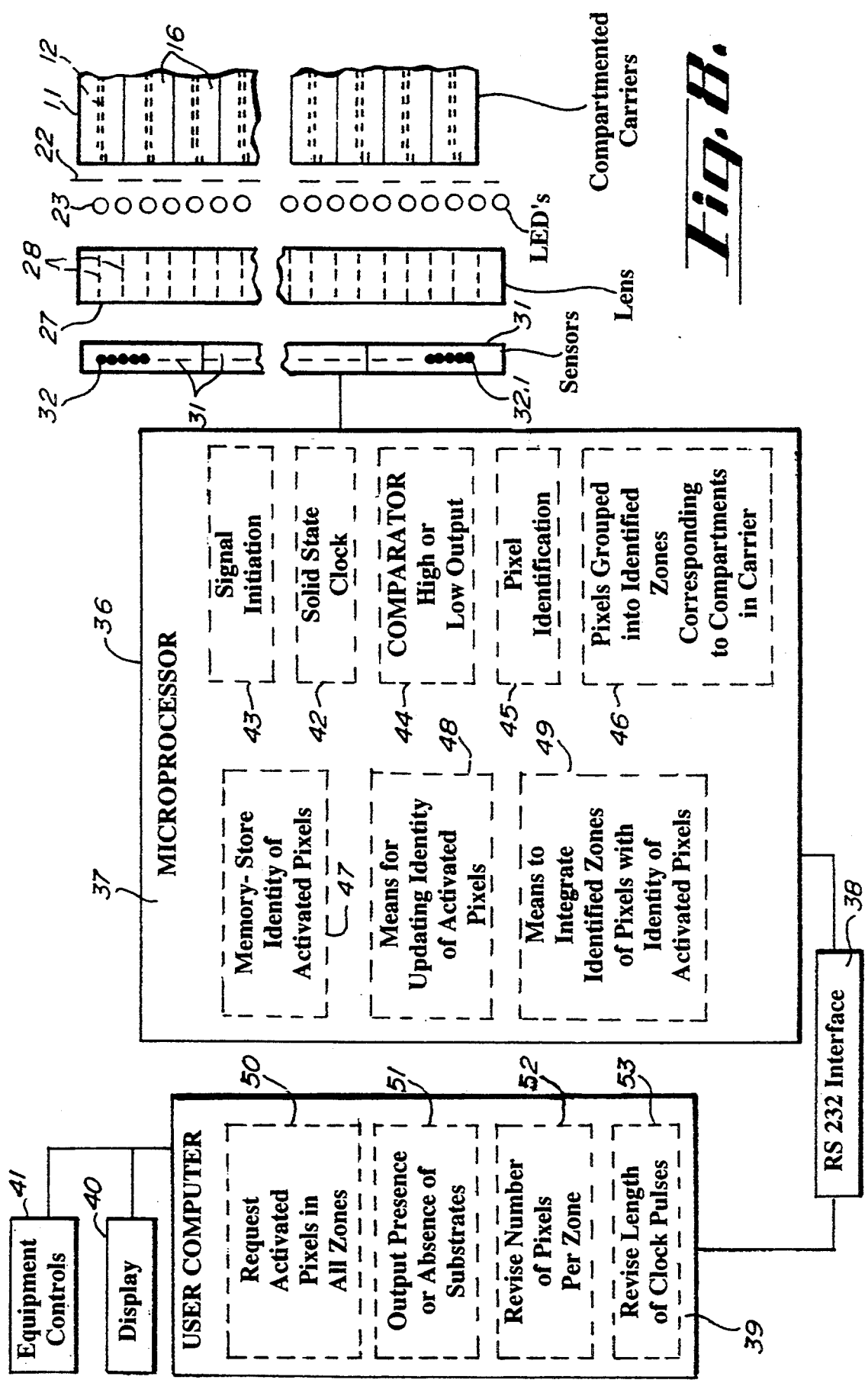

SUBSTRATE LOCATION AND DETECTION APPARATUS

This invention relates to apparatus for determining the location and presence of substrates contained in a carrier.

BACKGROUND OF THE INVENTION

In the processing of substrates such as semiconductor wafers in the manufacture of circuit chips, and such as substrates for liquid crystal displays (LCDs), the substrates are grouped together in carriers or cassettes for handling by automated equipment. Such substrates are extremely valuable because a great amount of process time and technology has been expended on the processing of the substrates. During processing and between process steps, substrates are conveniently carried in substrate carriers or cassettes which accurately locate the substrates so that they may be handled by automated equipment. However, it is important to determine the exact location of each substrate and determine the presence of a substrate in each intended location. Also, it is important to determine the existence of more than one substrate in a situation where only one substrate is intended to be present.

Previous methods of determining presence and location of substrates has not been altogether satisfactory with the degree of accuracy required in modern processing techniques.

SUMMARY OF THE INVENTION

An object of the invention is to provide a device to determine the existence and location of substrates in a carrier.

Another object of the invention is to provide a device to determine the existence and relative location of one or more target objects of the type having portions with light reflecting characteristics.

A feature of the invention is a multiplicity of LED's providing an intense column of light, such as infrared radiation, adjacent the edge portions of a stack of spaced substrates, a multiplicity of light transmitting devices or lenses transmitting light reflected off the substrate edge portions, and a multiplicity of photodetectors or sensors defining a substantially linear array of pixels receiving the light transmitted by said lenses.

The infrared light reflected from the substrate edge portions is focused to impinge certain of the pixels in the linear array; and the infrared light from the LED's which is directed into the spaces between the substrates is not reflected as to be usefully directed through the lenses and onto the pixels. Accordingly, the infrared light directed onto the sensors impinges a number of activated clusters of pixels, and the clusters of light impinged pixels are spaced from each other by other quiescent clusters of pixels upon which no activating reflected infrared light impinges.

The effect is that the activated clusters of pixels are grouped and spaced from each other almost identically to the manner in which the substrates are grouped and spaced from each other. The sizes of the light-activated clusters of pixels is substantially uniform in the same way that the substrate edge portions are substantially uniform in thickness. In the event that two substrates are lying together, instead of being spaced apart, the infrared light reflected from the adjoining edge portions of two such substrates may create a light-activated cluster of pixels which is substantially larger than adjacent light-activated clusters because the area of the light reflecting off both substrates may be substantially larger than the areas of light impinging adjacent clusters from single substrates; and alternately, two substrates lying against each other may reflect light onto two light-activated clusters of pixels spaced from each other by a distance substantially less than the spacing between other nearby light activated clusters of pixels.

The bank of LED's may be moved in a direction to move the column of light in a direction transversely and generally along the adjacent substrate edge portions, as contrasted with a direction toward or away from the substrate edge portions. Such adjustment of the bank of LED's may provide increased localized light intensity as may be needed with irregular shapes of portions of certain substrates in order to obtain enough reflected light to properly activate the adjacent pixels.

Another feature of the invention comprises such a light source, light-transmitting device and sensors in combination with analyzing means determining the identity and locations of the light-activated clusters of pixels which also represent the identity and locations of the substrates in a compartmented carrier. The light transmitting devices are arranged in a column along the carrier and the stack of spaced substrates therein and define a field of view which substantially corresponds with the linear array of pixels upon which light from the light transmitting devices may impinge. The analyzing means, or microprocessor, repeatedly causes the pixels to be scanned for light-activated pixels and records in its memory the identity of pixels which have been activated by reflected light from the substrate edges. The memory is continuously updated by continuous scanning of the linear array of pixels.

The clock applies pulses to the pixels, in order along the linear array of pixels, causing the pixels to sequentially discharge their output voltages which have been induced by the impingement of reflected light. The analog output voltages are digitized by a comparator to high or low outputs for each pixel, which are then stored in the memory along with the identity of the pixel.

In most cases, the minute pixels have center-to-center spacing which is substantially less than the thickness dimensions of a substrate, and accordingly, light reflected from the edge portion of a substrate impinges and activates a plurality of pixels in a cluster.

The linear array of pixels, being opposite the light transmitting lenses and reflecting substrate edge portions, defines the field of view. Whereas the compartment carrier or substrate supporting means defines a multiplicity of equally sized substrate compartments to support a like number of substrates, the microprocessor divides its field of view represented by the linear array of pixels into a multiplicity of zones, each defined by a number or group of pixels. Typically, the size of a substrate compartment may be 0.188 inch (0.478 cm) and a group or zone of pixels representing such a compartment may typically include about 50 pixels spaced center to center at about 0.005 inch (125 micrometers); and within such a zone, the reflected light from a substrate edge portion of 0.025 inch (0.064 cm) impinges and activates 5 pixels.

When the user computer requests information from the microprocessor, the record of the activated pixels is integrated with the definition of the zones or groups of pixels to produce a report of those zones containing clusters of activated pixels, which may be recognized as a report of the presence and location of substrates in the carrier. The user computer may use the report of presence and location of the substrates in any of a number of ways, such as to display the identity of carrier compartments which contain substrates, and compartments which are empty of substrates.

In the event that a different compartmented carrier is used, with different sizes of compartments, the user computer may supply necessary information to the microprocessor in order to cause the microprocessor to newly divide the linear array of pixels into zones of different dimensions to again correspond to the sizes of the substrate compartments in the carrier.

In the event that more than one substrate occupies a substrate compartment in the carrier, the reflected light activates two clusters of pixels or one cluster of substantially larger size than activated pixel clusters nearby. The change in the number of activated pixel clusters in a zone, or in the size of an activated pixel cluster in the zone, will be recorded in the microprocessor memory and reported to the user computer when information is requested.

The user computer may also revise the functioning of the clock as to increase the time between pulsing each of the pixels, thereby increasing the time during which reflected light impinges each pixel as may be necessary with certain substrates under analysis.

"Wherein the word 'light' is used, the word 'light' is meant to include both visible and invisible radiation."

BRIEF DESCRIPTION OF THE DRAWINGS

FIG. 3 is a partial perspective view illustrating the array of LED's adjacent the substrates and the inlet portion of the light transmitting lens means.

FIG. 4 is an enlarged top plan view of the substrate detecting apparatus and illustrating the intense application of infrared light onto the edge portions of the substrates for reflection therefrom.

FIG. 7 is an enlarged detail section view taken approximately at 7—7 of FIG. 4.

FIG. 8 is a diagrammatic view illustrating the functions of the detection apparatus and its microprocessor and user computer.

DETAILED SPECIFICATION

The substrate detecting and locating apparatus is indicated in general by numeral 10.

Figure 2:
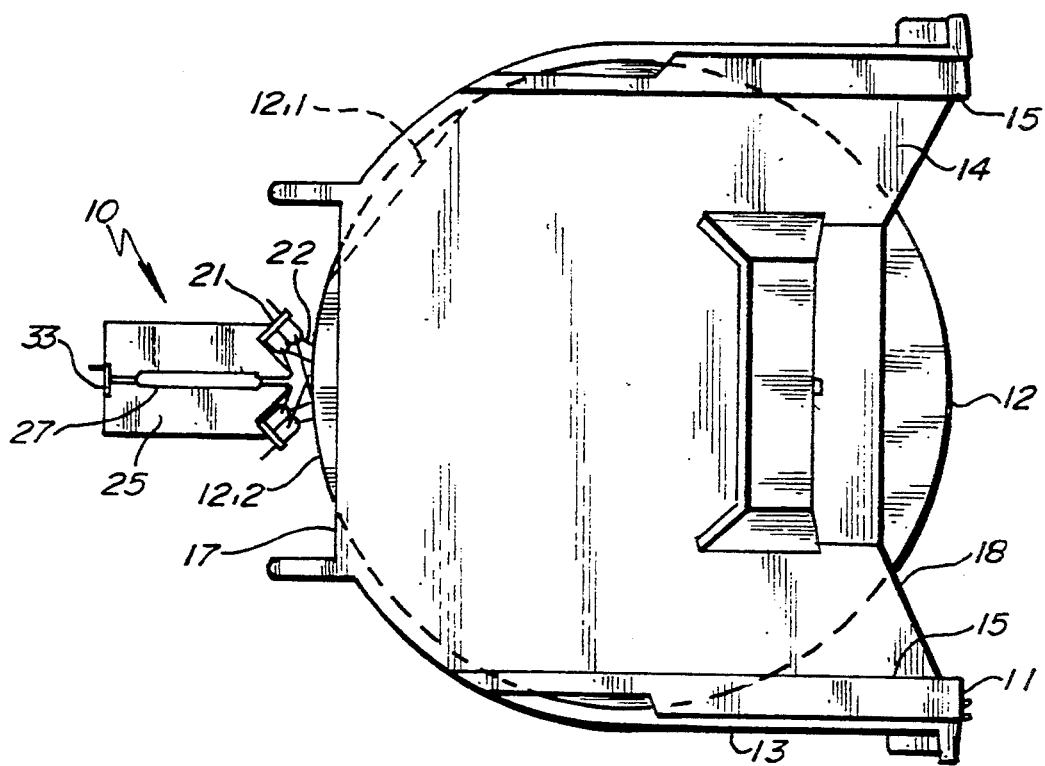
FIG. 2 is a top plan view of the substrate detecting apparatus and the wafer carrier with substrates contained therein.
Figure 1:
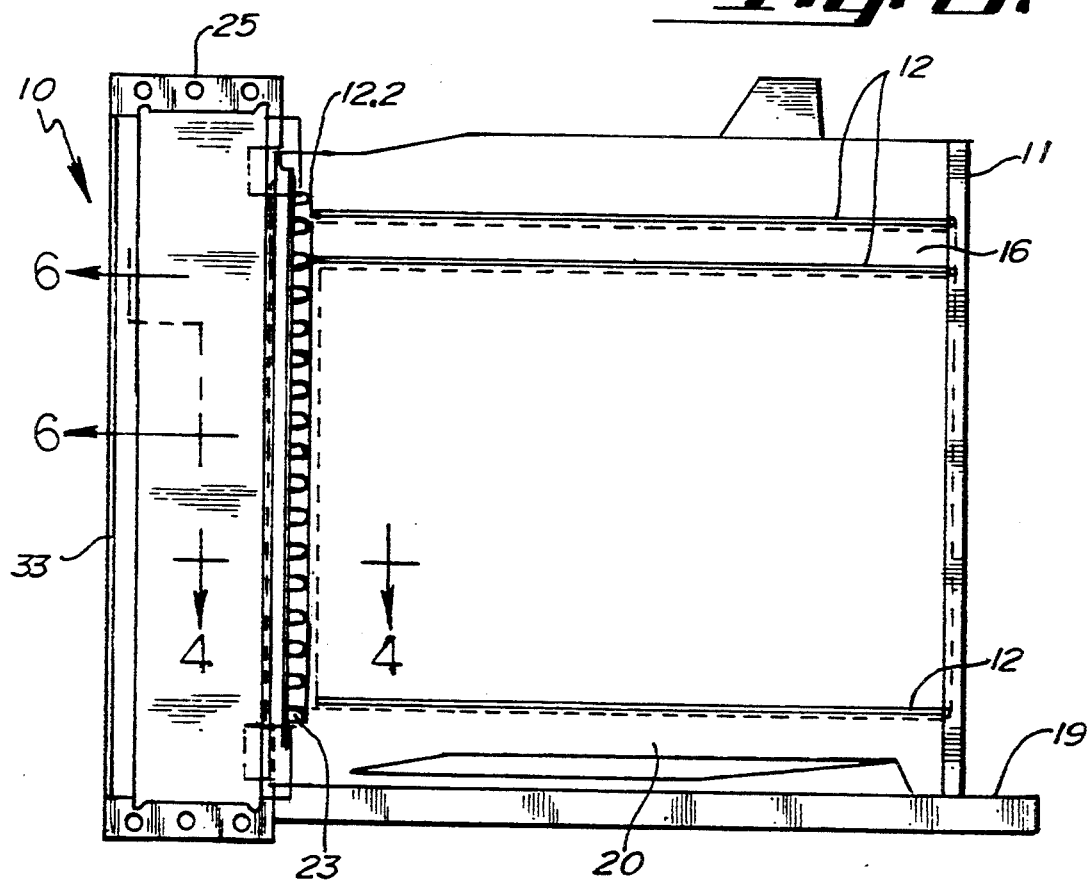
FIG. 1 is a side elevation view of the substrate detecting apparatus and a wafer carrier containing a number of substrates.

A wafer carrier 11 is illustrated and carries a plurality of semiconductor substrates or wafers 12 therein. The sidewalls 13 of the carrier are interconnected by end walls 14 which are formed integrally of the sidewalls and hold the sidewalls in precise position with respect to each other. Each of the sidewalls has a multiplicity of internal ribs or spacers 15 along the inner side of the sidewalls 13 for the purpose of supporting the wafers or substrates 12 and defining compartments adjacent to and between the ribs 16 wherein the wafers 12 are to be confined. The carrier 11 has an open bottom 17 and an open top 18. The substrates or wafers 12 protrude slightly through the open bottom 17 of the carrier as to be visible at that location. Most of the substrates 12 are circular in shape and many of the substrates have a flattened side or edge portion which is illustrated in FIG. 2 and designated by the numeral 12.1. As the substrates 12 are confined in the carrier 11, the flattened sides or edge portions 12.1 may be randomly located in the carrier, and in some cases, the flattened sides or edge portions 12.1 may all be aligned in a certain direction.

The substrates are commonly made of a rigid material such as silicon and the edge portions 12.1, 12.2 are smooth and have a polished appearance as to be reflective of light whether it be visible light or in the infrared spectrum.

A suitable support or table 19 is provided for the carrier and the end portion 20 of the carrier rests upon the support 19 for accurately locating the carrier.

An elongate means 21 generates an intense column 22 of light closely adjacent the open bottom side 17 of the carrier 11 and adjacent the edge portions 12.2 of the substrates 12 contained in the carrier. While the intense column of light 22 may be visible light, in the preferred form the column of light consists of infrared radiation generated by and projecting from a multiplicity of LED's 23 mounted on elongate upright circuit boards 24 which are oriented obliquely of each other as to arrange the LED's 23 in a pair of elongate upright arrays 23a, 23b of LED's. The arrays 23a, 23b of LED's are oriented transversely or obliquely of each other so that all of the LED's contribute to the intense column 22 of light which impinges upon the reflective edge portions 12.2 of the wafers or substrates 12. As suggested in FIGS. 2 and 4, the radiation from the LED's 23 has directionality so as to reflect from the reflective edge portions 12.2 in reflected beams.

The arrays 23a, 23b of LED's extend all along the open bottom portion 17 of the carrier as to direct light onto all of the edge portions 12.2 of all of the wafers or substrates 12 contained in the carrier 11. The individual LED's on the circuit boards 24 are offset or staggered with respect to each other as to make the intense column 22 of light as homogenous as possible.

Figure 5:
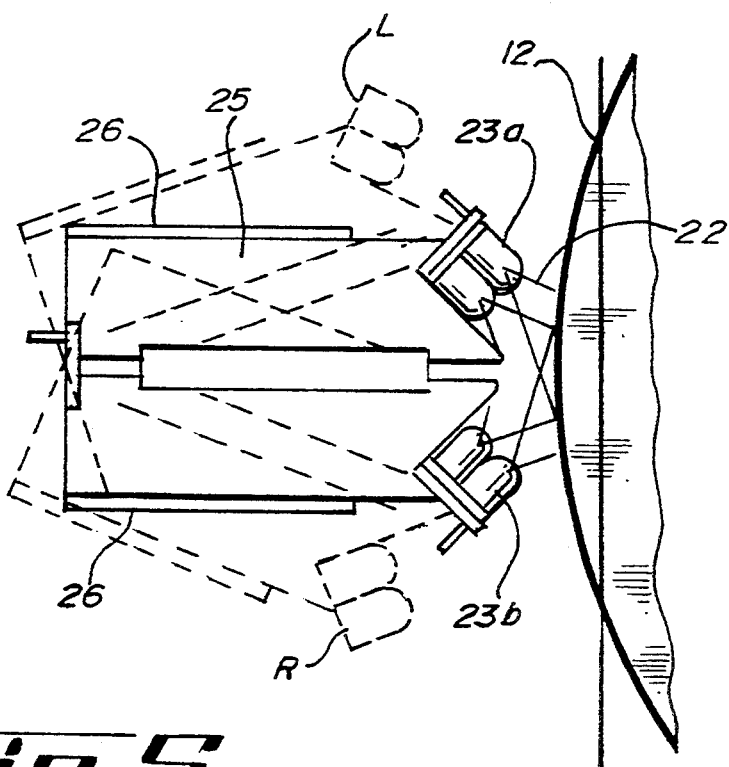
FIG. 5 is an enlarged detail top plan view illustrating the substrate detecting apparatus and illustrating the adjustable positions thereof.

The circuit boards 24 which mount the LED's are secured onto a plastic molded frame or housing 25 which is carried on suitable brackets 26 as to locate the arrays 23a, 23b of LED's close to the edge portions of the substrates 12. The mounting brackets 26 permit swingable adjustment of the arrays 23a, 23b of LED's into alternate positions L and R, as illustrated in FIG. 5 wherein the LED's and the frame 25 may be swung about an upright axis extending generally parallel to the intense column 22 of light. This adjustability is useful in certain circumstances as to move one or the other arrays 23a, 23b of LED's closer to the substrates 12, as may be necessary under certain circumstances in order to fully illuminate any flat sides or edge portions 12.1 that may be adjacent the column 22 of intense light.

Figure 6:
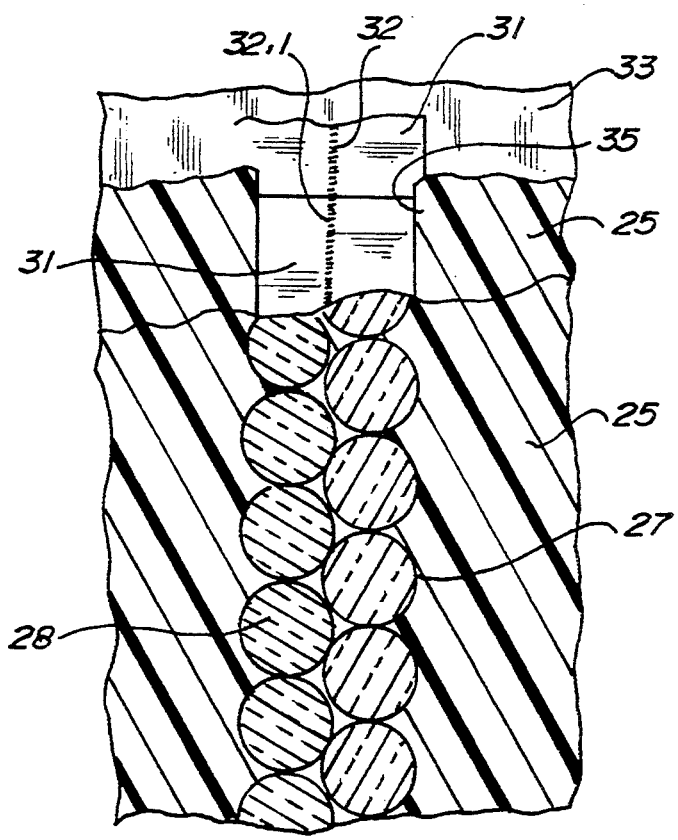
FIG. 6 is an enlarged detail section view taken approximately at 6—6 of FIG. 1.

The frame 25 which mounts the LED circuit boards 24 also mounts a highly directional lens means 27 for transmitting light reflected from the reflective edge portions 12.2, 12.1 of the substrates, and in a direction transversely of the intense column 22 of light generated by the LED's 23. More specifically, the lens means 27 comprises a multiplicity of SELFOC® lenses 28 affixed in the frame or housing 25 and arranged in a double row or stack wherein the individual lenses 28 lie flush against each other, substantially as illustrated in FIGS. 6 and 7. SELFOC ® is a registered trademark of Nippon Sheet Glass Company Limited to Osaka, Japan. The rows of SELFOC ® lenses 28 extend throughout the entire height of the intense column 22 of light, and also along the entire length of the stack of spaced substrates 12 so that the edge portions 12.2 of the substrates are directly opposite portions of the rows of lenses 28. The lenses 28 are transparent rod-like elements, and in the preferred form, are approximately 0.075 inch (0.19 cm) in diameter, and are approximately one inch (2.54 cm) in length. The lenses 28 have one-to-one optical power, and the image in each lens is inverted twice and merged with the images from neighboring lenses.

As a result, the beams 29 of light reflected from the edge portions 12.2 of the substrates 12 are received through the inlet portions 28.2 and transmitted through the lenses, and the lenses project beams 30 from the outlet portions 28.1 of the lenses which are substantially identical to the beams 29 of reflected light being directed into the inlet portions 28.2 of the lenses. Whereas the thickness of each of the substrates 12 may be in the range of 0.025 inch (0.064 cm), and the spacing between the substrates 12 in the carrier is typically in the range of 0.188 inch (0.48 cm), the size of the beams 30 adjacent the outlet portions 28.1 of the lenses 28 has substantially the same thicknesses and spacings as the beams impinge upon the sensors 31 and the pixels 32 thereon.

Photo detectors or sensors 31 are mounted edge to edge with each other on a printed circuit board 33 which is affixed on the frame 25 opposite the outlet portions 28.1 of the lenses. The frame or housing 25 defines an elongate slot 34 adjacent the inlet portions 28.2 of the lenses; and the frame or housing 25 also defines an elongate slot 35 opposite and adjacent the outlet portions 28.1 of the lenses. The slots 34 and 35 extend along the entire length of the housing or frame 25 and along the entire length of the rows of lenses and along the entire length of the column 22 of intense reflected light adjacent the substrates 12 so as to receive and pass the beams 29 of reflected light from the edge portions 12.2 of the substrates and to the inlet portions 28.2 of the lenses 28. The outlet slots 35 also extend along the entire height of the frame 25 adjacent the rows of lenses 28 as to pass the beams 29, 30 of light projected from the lenses 28 as to impinge upon the pixels 32 of the sensors 31. The spacing between the inlet portions 28.2 of the lenses and the light reflecting edge portions 12.2 of the substrates is important to the focusing of the beams 29 of light as they enter and are transmitted by the lenses 28; and the spacing between the outlet portions 28.1 of the lenses, and the sensors 31 and pixels 32 is also important in order that the beams 30 will be properly focused at the pixels 32.

In the preferred form, the printed circuit board 33 carries twenty-four pieces 31 of silicon; and each of the pieces of silicon has sixty-four pixels thereon. Each of the pixels has a dimension of approximately 0.005 inch (125 micrometers) and the pixels have a center-to-center spacing identical to their size so that the pixels lie edge-to-edge against each other. The pixels are arranged in a linear array 32.1 extending throughout the full length of the lens means 27 and throughout the full length of the column 22 of intense light; and all together in the preferred form, the linear array 32.1 includes 1,536 pixels. Whereas the thicknesses of the substrates approximates 0.025 inch (0.064 cm) and the lenses 28 produce a one-to-one optic coupling, the beams 30 each span approximately five pixels as the reflected light in the beam 30 impinges upon the pixels which are thereby activated. The pixels, when activated by the beams of reflected light, generate voltage outputs more specifically discussed hereinafter.

Responsive means 36 are also provided for responding to and transmitting the indications received from the pixels 32 of the reflected light beams 30 impinging thereon and therefor of the presence of the substrates 12 in the carrier 11. The responsive means takes the form of a microprocessor 37, an RS 232 interface 38, and a user computer 39 which may have at its output, a display 40 for graphically displaying the identity and location of the substrates in the carrier; or the output may be in the form of equipment controls 41 which may control the equipment used to handle the carriers 11 and the substrates 12 therein.

As the beams 30 of light impinge upon the sensors 31 and the pixels 32 thereof, the photons cause the pixels to develop an electrical charge or voltage thereon; and the more photons that hit a particular sensor will cause the charge being created therein to be higher. The microprocessor 37 has a clock 42, which generates a series of pulses when its operation is initiated, and the pulses are progressively applied to each of the pixels 32 on a first sensor 31 and then progressively applied to the pixels on a second sensor 31 and then to a third sensor and then to a fourth, a fifth, until the clock pulses have been progressively applied to all of the pixels on all of the sensors. When such a cycle of operation of the microprocessor has been completed, a signal initiation signal 43 is applied to the clock 42 in order to initiate a new cycle of operation. As the pulses from clock 42 are progressively applied to each of the pixels 32, each of the pixels will in turn respond by producing an analog voltage output signal. Those pixels which have been activated by beams 30 of reflected light from the edge portions 12.2 of the substrates 12, will produce voltage output signals which have substantially greater magnitude than those from pixels which have not been so activated. In this regard, it should be understood that in the spaces 12.3 between the substrates 12 in the carrier 11, there is nothing to reflect light from the column 22 of intense light, and accordingly, there are numerous pixels between beams 30 of light, which are not activated and photons have not been available to produce the charges on such pixels.

The analog output voltage signals are progressively applied to a digitizing means or comparator 44 in the microprocessor which converts the analog voltage output signals to binary output signals. The microprocessor has been programmed for pixel identification 45 so that each of the pixels on each of the sensors 31 has a suitable identification.

Also, the microprocessor 37 groups the pixels 32 into a multiplicity of identified zones 46 which corresponds to the number of compartments 16 in the substrate carrier 11. The information concerning the pixel identification and the zones of pixels corresponding to the compartments 16 in the carrier has been stored in the microprocessor memory 47.

As the clock pulses induce analog voltage output signals to be transmitted from the pixels to the comparator, and as the comparator digitizes those signals, each of the analog output signals for each pixel is transmitted to the means 48 in the microprocessor for updating the identity of activated pixels which then transmits the information concerning the identity of activated pixels into the memory 47. When the memory 47 has received updating information for the whole linear array of pixels, the memory will cause initiation of the initiation signal 43 again so as to start the clock operating again to repeat its generation of clock pulses to the pixels. As the clock generates its 64 pulses progressively into each sensor 31, the 65th pulse will obtain from the sensor an end-of-scan pulse, which end-of-scan pulse is fed into the next sensor 31 as a beginning-of-scan pulse in order to commence the progressive application of clock pulses into each of the sensors.

The microprocessor continues to scan the pixels and obtain the output signals therefrom and store the information concerning each pixel in the memory 47 so that the microprocessor continues to have up-to-date information about the identity and location of each of the pixels which has been activated.

The microprocessor 37 also includes a means to integrate 49 the identified zones of pixels from the grouped pixels 46, and with the identification of the activated pixels in the memory 47 so that this information may be transmitted to a user computer 39 when requested.

The user computer 39 has the facility 50 to request the activated pixels in all the zones, and will receive information from the microprocessor 37 for this purpose. The information concerning the request of activated pixels will be used to produce the output 51 indicating the presence or absence of substrates in each of the zones, and that information may be directed to the display 40 or to the equipment controls 41, or both. The user computer also has a facility 52 for revising the number of pixels in each zone so as to affect the grouping indicated by the numeral 46 of pixels in the several zones corresponding to the sizes of the compartments 16 in the carrier 11. This facility accommodates the use of various carriers, as required in the ordinary use of this equipment.

The user computer 39 also has a facility 53 to revise the length of the clock pulses generated by the clock 42 in order to change the number of photons which will reach the activated pixels. The length of the clock pulses may be important to obtaining a clear operation of the equipment for use with various types of substrates that are available.

I claim:

1. Apparatus for detecting presence and location of substrates having reflective edge portions, comprising
   elongate radiation emitting means generating a column of light directed transversely of the column,
   substrate supporting means carrying the substrates in confronting and spaced relation to each other and with the reflective edge portions spaced transversely from the column of light to be intensely illuminated thereby and to reflect light therefrom,
   a highly directional lens means transmitting light reflected from said reflective edge portions and in a direction transversely of said column of light and said lens means comprising inlet portions disposed all along the column of light and opposite the reflective edge portions of the substrates to receive reflected light therefrom, there being a substantial absence of reflecting light from the spaces between the substrates, said lens means also comprising outlet portions beaming the reflected light therefrom,
   and light sensing means adjacent the outlet portions of the lens means and receiving the beamed reflected light therefrom, the light sensing means comprising a multiplicity of light sensing pixels activated by the reflected light impinging thereon and producing electrical indications when activated, said pixels being arranged in a linear array opposite to the outlet portions of the lens means, the beamed reflected light from an edge portion of each substrate impinging upon and activating a cluster of pixels to produce an indication of the presence of a substrate opposite to the cluster of pixels and to the lens means,
   and responsive means responding to and transmitting the indications from the pixels of the presence of the substrates.

2. Apparatus according to claim 1 wherein the elongate radiation emitting means generates light in the infrared frequency range.

3. Apparatus according to claim 1 wherein the lens means comprises a multiplicity of directional light transmitting lenses transmitting reflected light transversely of the column of light between the edge portions of the substrates and the light sensing means.

4. Apparatus according to claim 3 wherein said light transmitting lenses are arranged in side-by-side relation to each other and all along the column of light.

5. Apparatus according to claim 3 wherein said light transmitting lenses are substantially rod shaped and lie along each other in a stack parallel to the column of light.

6. Apparatus according to claim 1 wherein said substrate supporting means comprises a substrate carrier with a multiplicity of spaced and parallel ribs upon which the substrates are supported.

7. Apparatus according to claim 1 wherein a housing supports said lens means and comprises an elongate open slot adjacent the inlet portions and extending all along the column of light.

8. Apparatus according to claim 1 wherein a housing supports said lens means and comprises an elongate open slot adjacent the outlet portions and extending all along the linear array of light sensing pixels.

9. Apparatus according to claim 1 wherein said lens means comprises directionality to transmit light received from a substantially narrow range of directions adjacent the inlet portions, said elongate radiation emitting means generating the intense column of light being disposed out of said narrow range of directions.

10. Apparatus according to claim 1 wherein said lens means comprises directionality to transmit and project light from said outlet portions in narrow beams onto said pixels.

11. Apparatus according to claim 9 wherein said column of light comprises column portions spaced from each other, said narrow range of directions extending between said column portions.

12. Apparatus according to claim 1 wherein said responsive means comprises a microprocessor with a clock progressively and repeatedly pulsing said pixels along the linear array and causing the activated pixels to produce voltage outputs, digitizing means converting the voltage outputs to binary signals related to the pixel identification, and memory means storing the binary signals for the pixels and recording the identification of activated pixels.

13. Apparatus according to claim 12 wherein the microprocessor also comprises means updating the identity of activated pixels in response to the repeated pulsing of the array of pixels by the clock.

14. Apparatus according to claim 12 wherein the substrate supporting means comprises a multiplicity of substrate storing and compartments, and the microprocessor also comprises means grouping the pixels along said linear array into a multiplicity of zones corresponding in a number and size to the substrate storing compartments, means identifying the zones containing activated pixels.

15. Apparatus according to claim 14 wherein output computer means transforms the identified zones containing activated pixels into substrate storing compartments with substrates stored therein.

16. Apparatus according to claim 15 wherein computer means connected with the microprocessor modifies said means grouping the pixels into revised zones to correspond to an alternate substrate supporting means defining a revised number of substrate storing compartments.

17. Apparatus according to claim 12 wherein computer means connected with the microprocessor modifies the clock to change the rate of pulsing the linear array of pixels 18. Apparatus for detecting presence and location of substrates having reflective edge portions, comprising
    carrier radiation supporting, aligning, stacking and spacing such substrates and comprising an open interior to confine the substrates,
    elongate radiation emitting means generating a substantially homogeneous column of light extending along the carrier means and adjacent to the substrates to illuminate an elongate field of view spanning the interior of the carrier means and reflective edge portions of the substrates therein and the non-reflective spaces between the substrates,
    highly directional lens means opposite to the carrier means and transmitting the entire field of view, said lens means comprising inlet portions arranged in an elongate stack extending all along the illuminated elongate field of view and the illuminated reflective edge portions of the substrates and the non-reflective spaces therebetween, the inlet portions receiving the reflected light from the edge portions, there being a substantial absence of reflected light from the non-reflective spaces between the substrates, said lens means also comprising outlet portions also arranged in an elongate stack and emitting an elongate image replicating the elongate field of view including portions thereof exhibiting presence and absence of reflected light, said elongate image comprising beams of light and dark spaces between the beams and respectively corresponding to the reflective edge portions of the substrates and the non-reflective spaces in the field of view,
    elongate light sensing means opposite to the outlet portions of the lens means and extending therealong, said elongate light sensing means receiving said elongate image including the beams of reflected light therein, the light sensing means comprising a multiplicity of light sensing pixels in a linear array opposite to the elongate outlet portions of the lens means and extending therealong, said array of pixels receiving and being activated by the beams of light in the elongate image and impinging thereon and said pixels producing electrical indications when activated, the pixels in the linear array being arranged together and having a size substantially smaller than one of said beams of light whereby to activate a multiplicity of clustered pixels with each such beam of light, when present, to produce an indication of the presence of a substrate at a certain location in the field of view,
    and responsive means responding to and transmitting the electrical indications from the pixels of the presence of the substrates.

19. An apparatus according to claim 18 wherein said pixels are arranged in edge-to-edge relation to receive the entire image from the lens means.

20. An apparatus according to claim 18 wherein said elongate radiation emitting means comprises an array of LED's each directing infrared radiation toward the carrier means and the edge portions of the substrates carried thereby, said LED array extending all along and spanning the carrier means to illuminate the entire elongate field of view.

21. An apparatus according to claim 18 wherein said lens means comprises an elongate row of rod-shaped lenses lying flush against each other, the row of lenses extending all along the field of view.

22. An apparatus according to claim 21 wherein said pixels are in edge-to-edge relation with each other, and the array of pixels extends all along the row of lenses to receive the entire elongate image of the field of view.

* * * * *